(12) United States Patent
Huang et al.

(10) Patent No.: US 10,763,875 B2
(45) Date of Patent: Sep. 1, 2020

(54) SWITCHED CAPACITOR CIRCUIT AND ANALOG-TO-DIGITAL CONVERTER DEVICE

(71) Applicant: Realtek Semiconductor Corporation, Hsinchu (TW)

(72) Inventors: Shih-Hsiung Huang, Miaoli County (TW); Chih-Lung Chen, Zhubei (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/524,352

(22) Filed: Jul. 29, 2019

(65) Prior Publication Data
US 2020/0228128 A1    Jul. 16, 2020

Related U.S. Application Data

(60) Provisional application No. 62/791,128, filed on Jan. 11, 2019.

(51) Int. Cl.
*H03M 1/38* (2006.01)
*H03M 1/08* (2006.01)
*H03K 5/24* (2006.01)

(52) U.S. Cl.
CPC ........ *H03M 1/0854* (2013.01); *H03K 5/2472* (2013.01)

(58) Field of Classification Search
CPC ...... H03M 1/0854; H03M 1/12; H03M 1/802; H03M 1/804; H03M 1/806; H03M 1/00; H03K 5/2472

(Continued)

(56) References Cited

U.S. PATENT DOCUMENTS 6,587,066 B1   7/2003  Somayajula
8,279,102 B2 * 10/2012  Lai .................... H03M 1/1215
                                                   341/155

(Continued)

FOREIGN PATENT DOCUMENTS

TW    201251341 A1    12/2012
TW    201715849 A1    5/2017

OTHER PUBLICATIONS

T.Cho et al., "A 10 b, 20 Msample/s, 35 mW pipeline A/D converter," IEEE Journal of Solid-State Circuits, vol. 30, No. 3, pp. 166-172, Mar. 1995.

(Continued)

*Primary Examiner* — Jean B Jeanglaude
(74) *Attorney, Agent, or Firm* — Locke Lord LLP; Tim Tingkang Xia, Esq.

(57) ABSTRACT

A switched capacitor circuit includes a first capacitor, a second capacitor, and a switching circuit. The first capacitor is configured to receive a first signal. The second capacitor is configured to receive a second signal. The switching circuit is configured to selectively couple the first capacitor and the second capacitor to an input terminal of a quantizer according to at least one clock signal. In a first configuration of the switching circuit, the first capacitor is configured to store the first signal, and the second capacitor is configured to store the second signal. In a second configuration of the switching circuit, the first capacitor and the second capacitor are stacked in series, in order to transmit a combination of the first signal and the second signal to the input terminal of the quantizer.

20 Claims, 5 Drawing Sheets

(58) Field of Classification Search
USPC .................................... 341/155, 161, 172
See application file for complete search history.

(56) References Cited

U.S. PATENT DOCUMENTS

| | | | |
|---|---|---|---|
| 8,710,896 | B2 | 4/2014 | Allen et al. |
| 8,786,484 | B2 | 7/2014 | Cheong et al. |
| 8,797,204 | B2 | 8/2014 | Yoon et al. |
| 8,952,839 | B2 | 2/2015 | Wang et al. |
| 9,030,346 | B2 | 5/2015 | Dey et al. |
| 9,041,569 | B2* | 5/2015 | Zhou ............ H03M 1/0617 |
| | | | 341/118 |
| 9,106,243 | B2 | 8/2015 | Lee et al. |
| 9,287,891 | B1* | 3/2016 | Lee ............ H03M 1/0641 |
| 9,847,790 | B2* | 12/2017 | Liu ............ H03M 1/145 |
| 10,050,639 | B1 | 8/2018 | Berens et al. |
| 10,171,097 | B1 | 1/2019 | Lin et al. |
| 2008/0129573 | A1* | 6/2008 | Mueck ............ H03M 1/0682 |
| | | | 341/163 |
| 2011/0122006 | A1 | 5/2011 | Liao et al. |
| 2012/0081244 | A1* | 4/2012 | Lai ............ H03M 1/1215 |
| | | | 341/122 |
| 2013/0147649 | A1 | 6/2013 | Cheong et al. |
| 2014/0049872 | A1 | 2/2014 | Huang et al. |
| 2014/0246562 | A1 | 9/2014 | Blerkom |
| 2014/0320330 | A1 | 10/2014 | Yang |
| 2018/0183450 | A1* | 6/2018 | Liu ............ H03M 1/1215 |

OTHER PUBLICATIONS

R. Lotfi et al., "A 1-V Mosfet-Only Fully-Differential Dynamic Comparator for Use in Low-Voltage Pipelined A/D Converters", Signals, Circuits and Systems, 2003. SCS 2003. International Symposium on.

* cited by examiner

SWITCHED CAPACITOR CIRCUIT AND ANALOG-TO-DIGITAL CONVERTER DEVICE

RELATED APPLICATIONS

This application claims priority to U.S. Provisional Application Ser. No. 62/791,128, filed Jan. 11, 2019, which is herein incorporated by reference in its entirety.

BACKGROUND

Technical Field

The present disclosure relates to a switched capacitor circuit. More particularly, the present disclosure relates to a switched capacitor circuit that provides a noise shaping function and an analog-to-digital converter using the same.

Description of Related Art

An analog-to-digital converter (ADC) has been widely applied to various electronic devices, in order to covert an analog signal to a digital signal for subsequent signal processing. As the need of processing data with high resolution (for example, video data) rises, the ADC is often the key component in the system. However, in practical applications, performance of the ADC is affected by several non-ideal factors, such as process variations, quantization noise, thermal noise, and so on.

SUMMARY

Some aspects of the present disclosure are to provide a switched capacitor circuit that includes a first capacitor, a second capacitor, and a switching circuit. The first capacitor is configured to receive a first signal. The second capacitor is configured to receive a second signal. The switching circuit is configured to selectively couple the first capacitor and the second capacitor to an input terminal of a quantizer according to at least one clock signal. In a first configuration of the switching circuit, the first capacitor is configured to store the first signal, and the second capacitor is configured to store the second signal. In a second configuration of the switching circuit, the first capacitor and the second capacitor are stacked in series, in order to transmit a combination of the first signal and the second signal to the input terminal of the quantizer.

Some aspects of the present disclosure are to provide an analog-to-digital converter (ADC) device that includes a switched capacitor circuit and a successive approximation register (SAR) circuitry. The switched capacitor circuit is configured to sample an input signal according to a plurality of clock signals. The SAR circuitry is configured to perform an analog-to-digital conversion on a sampled input signal according to a conversion clock signal, in order to generate a digital output. The switched capacitor circuit includes a first capacitor and a second capacitor. The first capacitor is configured to store a first residue signal associated with the sample input signal. The second capacitor configured to store a second residue signal that is generated based on the first residue signal in a previous conversion phase, in which the first capacitor and the second capacitor are stacked in series, in order to provide a combination of the first residue signal and the second residue signal to the SAR circuitry in the analog-to-digital conversion.

As described above, the switched capacitor circuit and the ADC device of embodiments of the present disclosure are able to provide a circuit architecture that has a noise-shaping function. As a result, the overall performance of the ADC device can be improved.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals.

For ease of understanding, like elements in each figure are designated with the same reference number.

Figure 1:
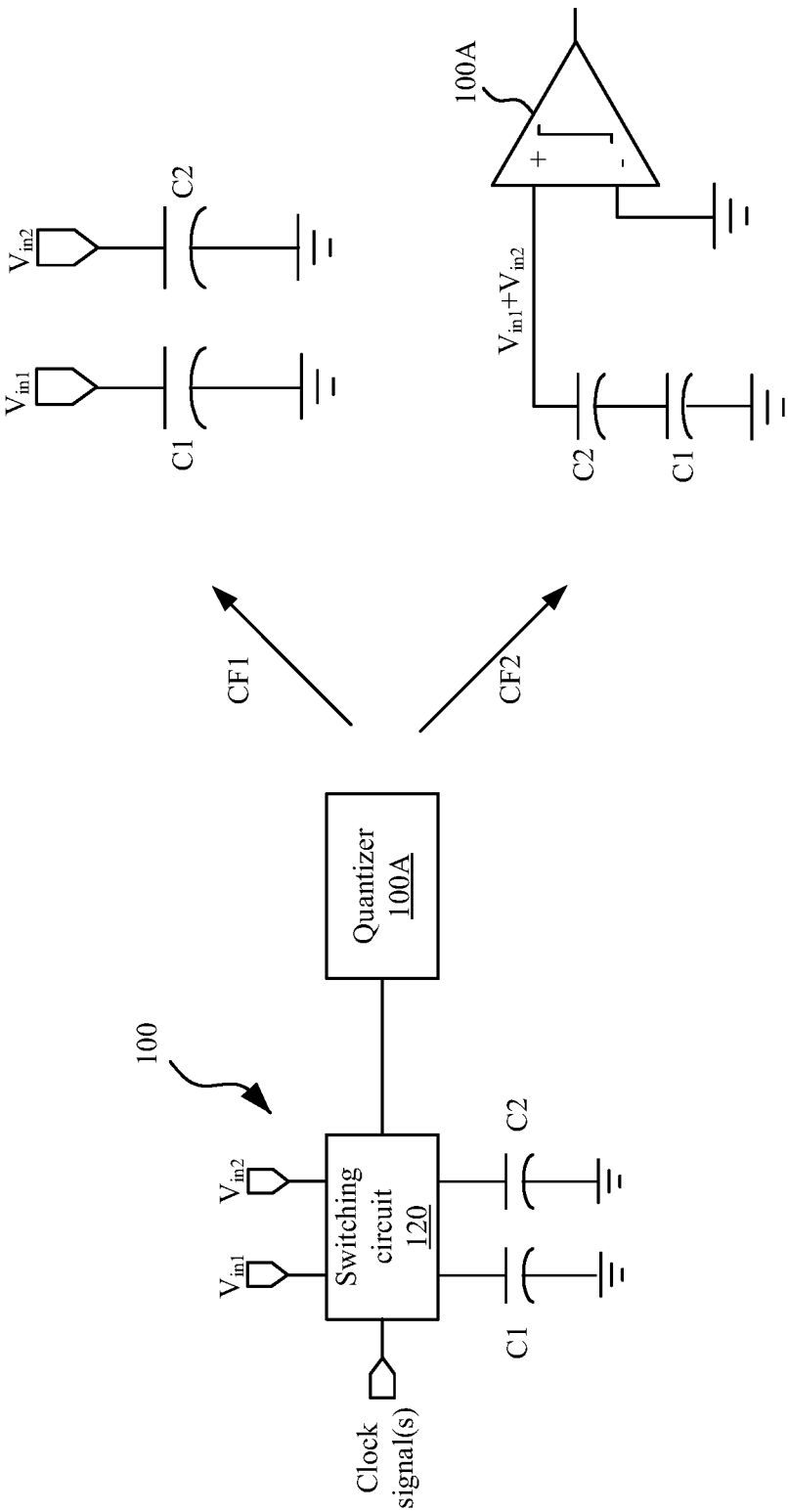
FIG. 1 is a schematic diagram of a switched capacitor circuit according to some embodiments of the present disclosure.

FIG. 1 is a schematic diagram of a switched capacitor circuit 100 according to some embodiments of the present disclosure. In some embodiments, the switched capacitor circuit 100 may be applied to mixed signal circuit.

For example, the switched capacitor circuit 100 may be applied to an analog-to-digital converter (ADC), in order to provide a noise shaping function. In some embodiments, the noise shaping function is a feedback of the quantization error to an input of the quantizer (e.g., quantizer 100A in FIG. 1 or comparator circuit 220 in FIG. 2A). With the noise shaping function, the spectral characteristics of the quantization noise can be changed (e.g., shaped), and the power of the quantization noise is at a lower level in lower frequency band and is at a higher level in higher frequency band. Thus, a desired signal in the lower frequency band may present higher signal-to-noise ratio.

As shown in FIG. 1, the switched capacitor circuit 100 is coupled to a quantizer 100A (e.g., a comparator in an ADC (not shown)). The switched capacitor circuit 100 includes capacitors C1-C2 and a switching circuit 120. In some embodiments, each of the capacitor C1 and the capacitor C2 may be formed with a single capacitive element or an array of capacitive elements. The capacitors C1-C2 are coupled to the switching circuit 120. The switching circuit 120 may include switches (e.g., switches in FIG. 2A), in order to selectively couple the capacitor C1 and/or the capacitor C2 to an input terminal of the quantizer 100A according to at least one clock signal (e.g., clock signals in FIG. 2B).

For example, in response to the at least one clock signal, the switching circuit 120 may operate in a first configuration CF1 or a second configuration CF2. In the first configuration CF1, the capacitors C1 and C2 may be disconnected from the input terminal of the quantizer 100A. Under this condition, the capacitor C1 is configured to store a signal $V_{in1}$, and the capacitor C2 is configured to store a signal $V_{in2}$.

In some embodiments, the signal $V_{in1}$ may be a signal from an input signal Vin sampled in k-th conversion phase (hereinafter refer to as "signal Vin(k)"). In some embodiments, the signal $V_{in1}$ may be a signal processed based on the signal Vin(k). For example, the signal $V_{in1}$ may be a residue signal that is generated by an ADC based on the signal Vin(k).

In some embodiments, the signal $V_{in2}$ may be a signal from a signal Vin sampled in a conversion phase prior to the k-th conversion phase. For example, the signal $V_{in2}$ may be a signal Vin(k−1) (e.g., signal sampled from the input signal Vin in a (k−1)-th conversion phase). In some embodiments, the signal $V_{in2}$ may be a signal processed based on the signal Vin(k−1). For example, the signal $V_{in2}$ may be a residue signal that is generated by an ADC based on the signal Vin(k−1). In some embodiments, the signal $V_{in1}$ may be a signal processed based on the signal Vin(k−1), Vin(k−2), . . . , and Vin(k−n), where k>n>0.

In the second configuration CF2, the capacitors C1 and C2 may be coupled in series and coupled to the input terminal of the quantizer 100A. Under this condition, a combination of the signals $V_{in1}$ and $V_{in2}$ are transmitted to the quantizer 100A for subsequent processing (e.g., analog-to-digital (A/D) conversion). Equivalently, a model of noise shaping may be introduced to the quantizer 100A. As a result, a signal-to-noise ratio of the output of the quantizer 100A can be increased.

In some embodiments, the combination of the signal $V_{in1}$ and $V_{in2}$ may be an integration of the signals $V_{in1}$ and $V_{in2}$. In some embodiments, the combination of the signals $V_{in1}$ and $V_{in2}$ may be a summation of the signals $V_{in1}$ and $V_{in2}$. In some embodiments, the combination of the signals $V_{in1}$ and $V_{in2}$ may be a difference between the signals $V_{in1}$ and $V_{in2}$. The above configurations of the signals $V_{in1}$ and $V_{in2}$ are given for illustrative purposes only, and the present disclose is not limited thereto.

Figure 2A:
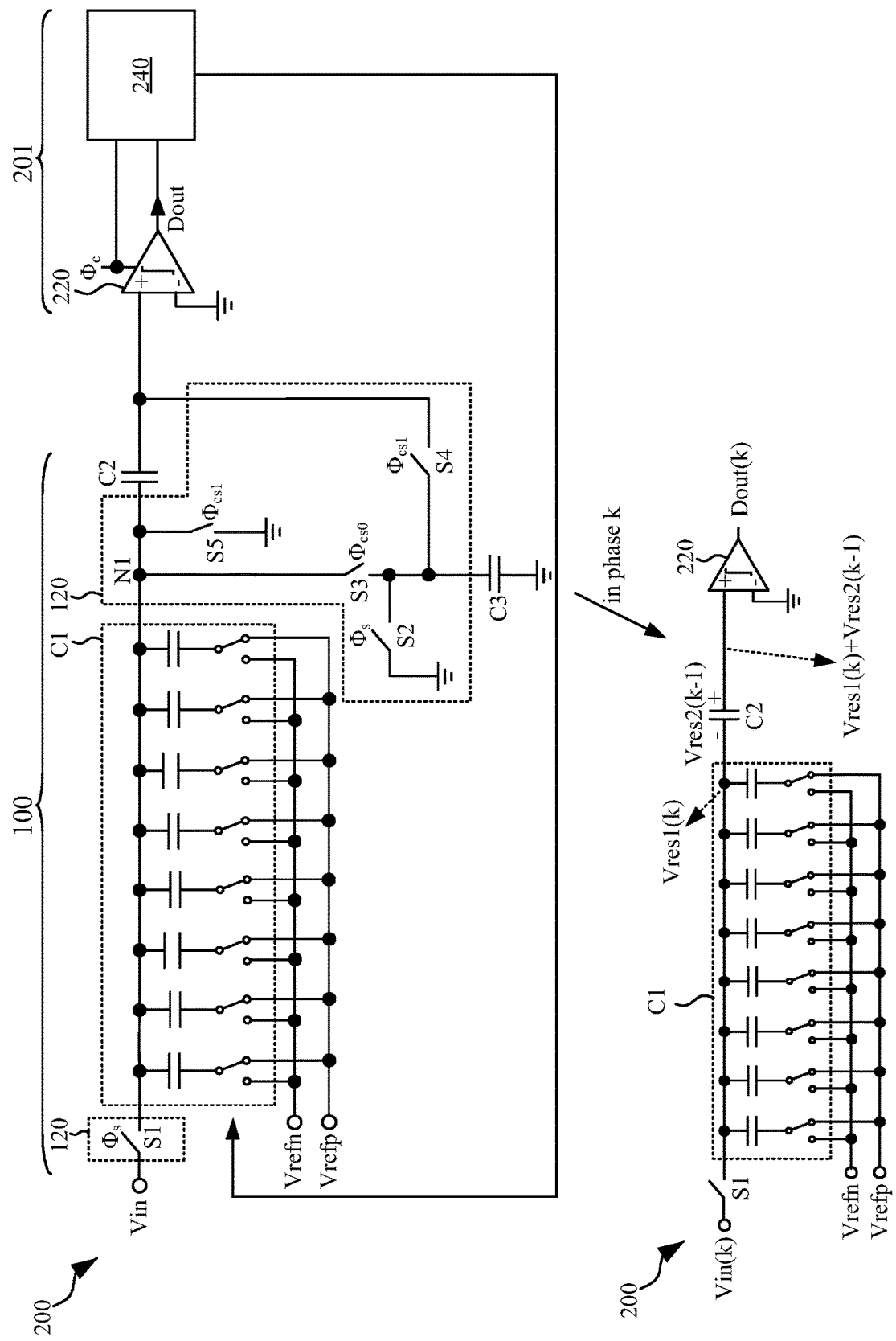
FIG. 2A is a schematic diagram of an analog-to-digital converter (ADC) device according to some embodiments of the present disclosure.

Reference is made to FIG. 2A. FIG. 2A is a schematic diagram of an ADC device 200 according to some embodiments of the present disclosure. In some embodiments, the switched capacitor circuit 100 in FIG. 1 may be applied to the ADC device 200.

In this example, the ADC device 200 operates as a successive approximation register (SAR) ADC. The ADC device 200 includes the switched capacitor circuit 100 and a SAR circuitry 201 that includes a comparator circuit 220, and a control logic circuit 240.

In this example, the switched capacitor circuit 100 includes capacitors C1-C3 and the switching circuit 120.

The capacitor C1 is formed with a binary capacitor array, and the binary capacitor array includes capacitors and switches controlled by the control logic circuit 240. A first terminal of the capacitor C1 is configured to receive the input signal Vin and is coupled to a node N1 that is between the first terminal of the capacitor C1 and a first terminal of the capacitor C2. A second terminal of the capacitor C1 is configured to selectively receive common mode voltages Vrefn or Vrefp under control of the control logic circuit 240. The second terminal of the capacitor C2 is coupled a first input terminal (e.g., a positive input terminal) of the comparator circuit 220. A second input terminal (e.g., a negative input terminal) of the comparator circuit 220 is coupled to ground. In some embodiments, the ground may be AC ground.

The capacitor C1 is configured to sample the input signal Vin and to generate reference voltages to the first input terminal of the comparator circuit 220 based on a binary search algorithm and the common voltages Vrefn and Vrefp. In some embodiments, the binary search algorithm is performed under control of the control logic circuit 240. The comparator circuit 220 and the control logic circuit 240 are enabled by a clock signal $\phi_C$ (e.g., a conversion clock signal) to perform operations of the binary search algorithm, in order to perform an analog-to-digital (A/D) conversion on the sampled signal Vin to decide a digital output Dout.

In some embodiments, the control logic circuit 240 may be implemented with a digital processing circuit and/or a digital logic circuit that performs the binary search algorithm, but the present disclosure is not limited thereto.

The switching circuit 120 includes switches S1-S5. A first terminal of the switch S1 is configured to receive the input signal Vin, a second terminal of the switch S1 is coupled to the first terminal of the capacitor C1, and a control terminal (not shown) of the switch S1 is configured to receive a clock signal $\phi_S$. A first terminal of the switch S2 is coupled to ground, a second terminal of the switch S2 is coupled to the node N1 via the switch S3, and a control terminal (not shown) of the switch S2 is configured to receive the clock signal $\phi_S$. A first terminal of the capacitor C3 is coupled to the second terminal of the switch S2, and a second terminal of the capacitor C3 is coupled to ground.

With this configuration, the switches S1-S2 are closed (e.g., conducted) in response to an enabling level of the clock signal $\phi_S$. Under this condition, the input signal Vin is sampled on the capacitor C1, and the capacitor C3 is reset to a ground level.

In response to an enabling level of the clock signal $\phi_c$, the comparator circuit 220 and the control logic circuit 240 perform the A/D conversion. In some embodiments, when the clock signal $\phi_S$ has the enabling level, the clock signal $\phi_c$ has a disabling level. Under this condition, the comparator circuit 220 is disabled, and thus provides high impedance at the first input terminal of the comparator circuit 220. Accordingly, when the input signal Vin is sampled to the capacitor C1 in response to the enabling level of the clock signal $\phi_S$, a signal path from the capacitor C2 to the comparator circuit 220 may be considered as an open circuit, and thus the sampling of the signal Vin is not affected by the capacitor C2.

In some alternative embodiments, an additional switch (not shown) may be employed to provide the above high impedance. For example, the additional switch is coupled between the node N1 and the first terminal of the capacitor C2 (or between the node N1 and the first terminal of the switch S5), and is open (e.g., not conducted) in response to the enabling level of the clock signal $\phi_S$ to provide the above high impedance. The additional switch is closed during the A/D conversion.

In some embodiments, the clock signal $\phi_c$ may be a group of synchronous clock signals. In some embodiments, the clock signal $\phi_c$ may be a group of asynchronous clock signals. Various settings of the clock signal $\phi_c$ are within the contemplated scope of the present disclosure.

A first terminal of the switch S3 is coupled to the node N1, a second terminal of the switch S3 is coupled to the first terminal of the capacitor C3, and a control terminal (not shown) of the switch S3 is configured to receive a clock signal $\phi_{cs0}$. With this configuration, the switch S3 is closed in response to an enabling level of the clock signal $\phi_{cs0}$. Under this condition, the capacitor C3 is coupled to the capacitor C1 via the conducted switch S3, in order to store a residue signal Vres1. In some embodiments, the residue signal Vres1 is generated in the A/D conversion or after the A/D conversion is completed.

A first terminal of the switch S4 is coupled to the second terminal of the capacitor C2, a second terminal of the switch S4 is coupled to the first terminal of the capacitor C3, and a control terminal (not shown) of the switch S4 is configured to receive a clock signal $\Phi_{cs1}$. A first terminal of the switch S5 is coupled to the node N1, a second terminal of the switch S5 is coupled to ground, and a control terminal (not shown) of the switch S5 is configured to receive a clock signal $\Phi_{cs1}$. With this configuration, the switches S4 and S5 are closed in response to an enabling level of the clock signal $\Phi_{cs1}$. Under this condition, the capacitor C2 is coupled to the capacitor C3 via the conducted switch S4, and the capacitor C3 carrying the residue signal Vres1 and the capacitor C2 are configured to share charges. After the charge sharing of the capacitors C2 and C3 is settled, each of the capacitors C2 and C3 stores a residue signal Vres2 (e.g., residue signal Vres2(k−1) shown in FIG. 2A).

Figure 2B:
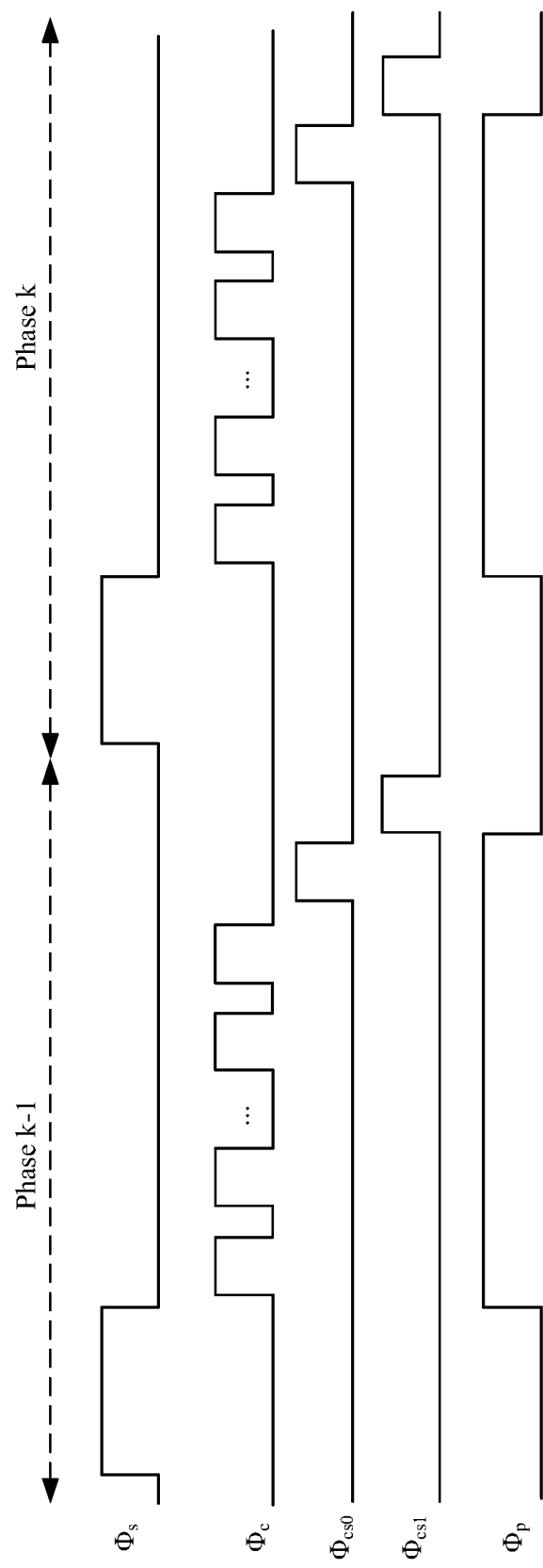
FIG. 2B is a schematic diagram illustrating waveforms of signals in FIG. 2A or FIG. 3 according to some embodiments of the present disclosure.

Reference is made to both of FIGS. 2A and 2B. FIG. 2B is a schematic diagram illustrating waveforms of signals in FIG. 2A or FIG. 3 according to some embodiments of the present disclosure.

As shown in FIG. 2B, in some embodiments, a time interval of the clock signal $\phi_c$ having the enabling level (e.g., high level) is configured to follow a time interval of the clock signal $\phi_s$ having the enabling level (e.g., high level). In other words, the time interval of the SAR circuitry 201 performing the A/D conversion follows the time interval of the switches S1 and S2 being conducted (e.g., the time interval of the input signal Vin being sampled).

In some embodiments, a time interval of the clock signal $\phi_{cs0}$ having the enabling level (e.g., high level) is configured to follow the time interval of the clock signal $\phi_c$ having the enabling level. In other words, a time interval of the switch S3 being conducted follows the time interval of the SAR circuitry 201 performing the A/D conversion.

In some embodiments, a time interval of the clock signal $\phi_{cs1}$ having the enabling level (e.g., high level) is configured to follow the time interval of the clock signal $\phi_{cs0}$ having the enabling level. In other words, a time interval of the switches S4-S5 being conducted follows the time interval of the switch S3 being conducted.

In phase k−1, when the clock signal $\phi_{cs1}$ has the enabling level, the switches S4 and S5 are closed. Under this condition, a residue signal Vres2(k−1) is applied to the capacitors C2 and C3. In some embodiments, the residue signal Vres2(k−1) is generated from the result of charge sharing of the residue signal Vres1(k−1) on the capacitor C3 and the residue signal Vres2(k−2) on the capacitor C2. The residue signal Vres1(k−1) indicates the aforementioned residue signal Vres1 generated in phase k−1. By this analogy, the residue signal Vres2(k−1) indicates the aforementioned residue signal Vres2 generated in phase k−1, and the residue signal Vres2(k−2) indicates the aforementioned residue signal Vres2 generated in phase k−2 (e.g., a phase prior to the phase k−1).

In phase k, when the clock signal $\phi_s$ has the enabling level (e.g., high level), the switches S1 and S2 are closed. Under this condition, the signal Vin(k) is sampled by the capacitor C1. Then, when the clock signal $\phi_c$ has the enabling level, the comparator circuit 220 and the control logic circuit 240 are enabled to perform the A/D conversion on the sampled signal Vin(k). In the A/D conversion, the sampled signal Vin(k) is then processed to be the residue signal Vres1(k). Under this situation, as shown in FIG. 2A, the capacitors C1 and C2 are stacked to provide a summation of the residue signals Vres1(k) and Vres2(k−1) to the first input terminal of the comparator circuit 220. Equivalently, the comparator circuit 220 quantizes the summation of the residue signals Vres1(k) and Vres2(k−1) to generate the corresponding digital output Dout(k). As a result, a noise transfer function having the characteristic of noise shaping of the ADC device 200 can be obtained.

In some embodiments, the residue signal Vres1(k) is varied in the A/D conversion. In some embodiments, in phase k, the residue signal Vres1(k) is varied when the clock signal $\phi_c$ has the enabling level.

Figure 3:
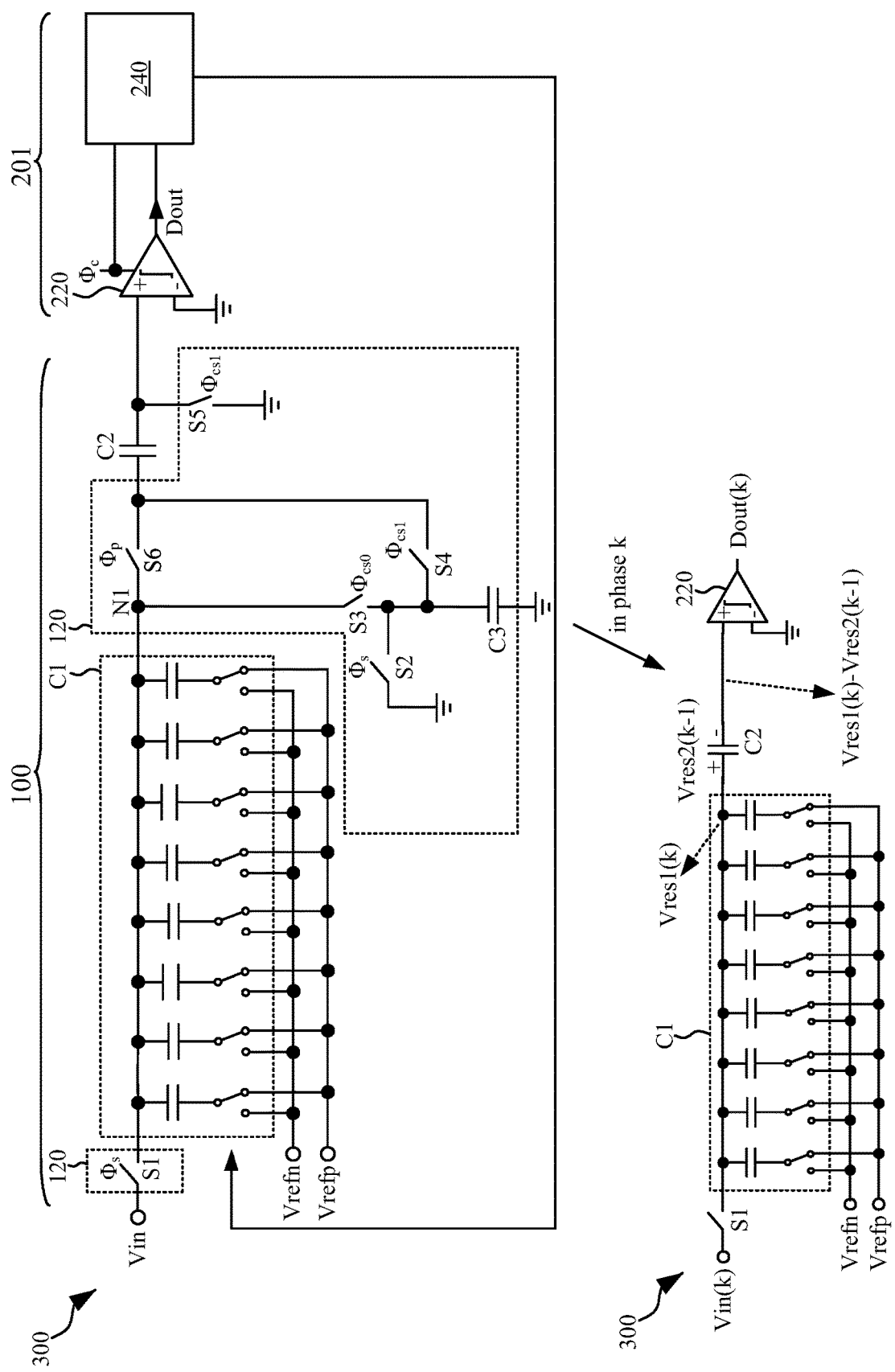
FIG. 3 is a schematic diagram of an ADC device according to some embodiments of the present disclosure.

Reference is made to FIG. 3. FIG. 3 is a schematic diagram of an ADC device 300 according to some embodiments of the present disclosure.

Compared to FIG. 2A, the switching circuit 120 in FIG. 3 further includes a switch S6, and the connections of the switches S4-S5 are changed. A first terminal of the switch S6 is coupled to the node N1, a second terminal of the switch S6 is coupled to the first terminal of the capacitor C2, and a control terminal (not shown) of the switch S6 is configured to receive a clock signal $\phi_p$.

In some embodiments, the clock signal $\phi_p$ may be a result of logic AND operation of the inverse of the signal $\phi_s$ and the inverse of the clock signal $\phi_{cs1}$. For example, as shown in FIG. 2B, when both of the clock signal $\phi_s$ and the clock signal $\phi_{cs1}$ have disabling levels (e.g., low level), the clock signal $\phi_p$ has an enabling level (e.g., high level). As shown in FIG. 2B, a time interval of the switch S6 being conducted is configured to follow a time interval of the switches S1-S2 being conducted.

In this example, the second terminal of the switch S4 is coupled to the first terminal of the capacitor C2. The first terminal of the switch S5 is coupled to the second terminal of the capacitor C2. With this configuration, when the clock signal $\phi_{cs1}$ has to the enabling level, the switch S6 is open, and the switches S4 and S5 are closed.

The operations of the ADC device 300 are similar with the operations of the ADC device 200. For example, in phase k−1, after the charge sharing of the capacitors C2 and C3 is settled, each of the capacitors C2 and C3 stores the residue signal Vres2(k−1), in which the polarity of the residue signal Vres2 in FIG. 3 is different from the polarity of the residue signal Vres2 in FIG. 2A.

In phase k, when the clock signal $\phi_s$ has the enabling level, the switches S1-S2 are closed. Under this condition, the signal Vin(k) is sampled by the capacitor C1. Then, when the clock signal $\phi_c$ has the enabling level, the comparator circuit 220 and the control logic circuit 240 are enabled to perform the A/D conversion on the sampled signal Vin(k) to generate the residue signal Vres1(k). Under this situation, as shown in FIG. 3, the capacitors C1 and C2 are stacked to provide a difference between the residue signals Vres1(k) and Vres2(k–1) to the input terminal of the comparator circuit 220. Equivalently, the comparator circuit 220 quantizes the difference between the residue signals Vres1(k) and Vres2(k–1), in order to generate the corresponding digital output Dout(k). Similar to FIG. 2A, a noise transfer function having the characteristic of noise shaping of the ADC device 300 can be obtained.

The level configurations of each clock signal in FIG. 2B are given for illustrative purposes only, and the present disclosure is not limited thereto.

Figure 4:
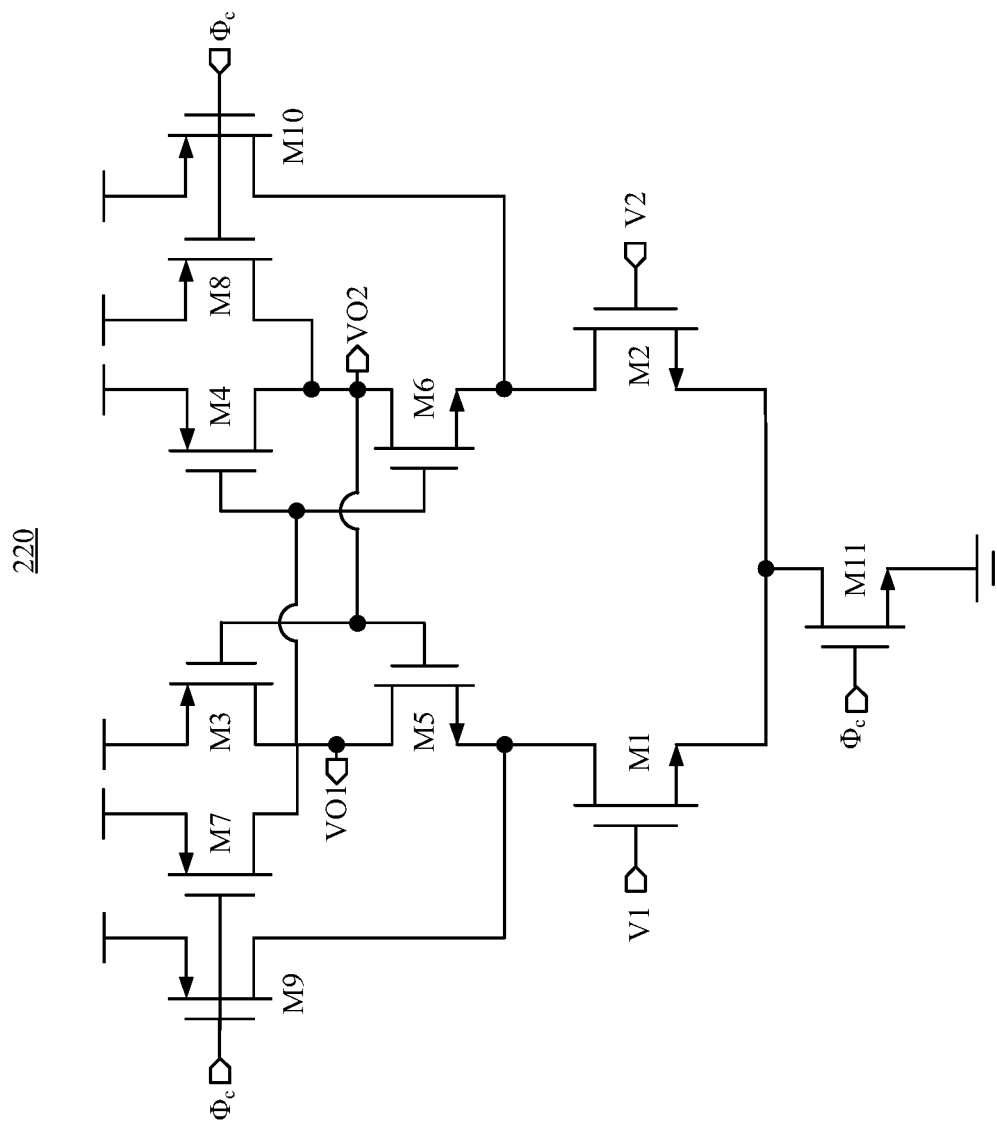
FIG. 4 is a schematic diagram of the comparator circuit in FIG. 2A or FIG. 3 according to some embodiments of the present disclosure.

Reference is made to FIG. 4. FIG. 4 is a schematic diagram of the comparator circuit 220 in FIG. 2A or FIG. 3 according to some embodiments of the present disclosure.

In some embodiments, the comparator circuit 220 may operate as the quantizer 100A. In FIG. 4, the comparator circuit 220 includes transistors M1-M11. The transistors M1-M2 operate as an input pair, in which a gate terminal of the transistor M1 receives a signal V1, and a gate terminal of the transistor M2 receives a signal V2. In some embodiments, the signal V1 may be a signal transmitted from the switched capacitor circuit 100, and the signal V2 may be a ground voltage.

The transistors M3-M6 operate as a latch circuit and an output stage circuit, in order to generate output signals VO1 and VO2 based on the operations of the transistors M1-M2. In some embodiments, one of the output signals VO1 and VO2 may be the digital output Dout in FIGS. 1, 2A, and 3.

The transistors M7-M10 operate as a reset circuit. For example, the transistors M7-M8 are configured to reset voltage levels of output terminals of the comparator circuit 220 in response to the disabling level of the clock signal $\phi_C$. The transistors M9-M10 are configured to reset the voltage levels of drain nodes of the input pair in response to the disabling level of the clock signal $\phi_C$.

The transistor M11 operates as a tail current source circuit, in order to bias the transistors M1-M10.

The above configuration of the comparator circuit 220 is given for illustrative purposes, and the present disclosure is not limited thereto. Various types of the comparator circuit 220 are within the contemplated scope of the present disclosure.

As described above, the switched capacitor circuit and ADC device of embodiments of the present disclosure are able to provide a circuit architecture that has a noise-shaping function. As a result, the overall performance of the ADC device can be improved.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A switched capacitor circuit, comprising:
   a first capacitor configured to receive a first signal;
   a second capacitor configured to receive a second signal; and
   a switching circuit configured to selectively couple the first capacitor and the second capacitor to an input terminal of a quantizer according to at least one clock signal, wherein in a first configuration of the switching circuit, the first capacitor is configured to store the first signal, and the second capacitor is configured to store the second signal, and in a second configuration of the switching circuit, the first capacitor and the second capacitor are stacked in series, in order to transmit a combination of the first signal and the second signal to the input terminal of the quantizer.

2. The switched capacitor circuit of claim 1, wherein the first signal is a signal processed based on an input signal sampled in a first phase.

3. The switched capacitor circuit of claim 2, the second signal is a signal processed based on the input signal sampled in a second phase, and the second phase is prior to the first phase.

4. The switched capacitor circuit of claim 1, wherein each of the first signal and the second signal is a residue signal generated from the quantizer.

5. An analog-to-digital converter device, comprising:
   a switched capacitor circuit configured to sample an input signal according to a plurality of clock signals; and
   a successive approximation register (SAR) circuitry configured to perform an analog-to-digital conversion on a sampled input signal according to a conversion clock signal, in order to generate a digital output;
   wherein the switched capacitor circuit comprises:
   a first capacitor configured to store a first residue signal associated with the sample input signal; and
   a second capacitor configured to store a second residue signal that is generated based on the first residue signal in a previous conversion phase, wherein the first capacitor and the second capacitor are stacked in series, in order to provide a combination of the first residue signal and the second residue signal to the SAR circuitry in the analog-to-digital conversion.

6. The analog-to-digital converter device of claim 5, wherein the switched capacitor circuit further comprises:
   a switching circuit configured to selectively couple the first capacitor and the second capacitor to the SAR circuitry according to the plurality of clock signals.

7. The analog-to-digital converter device of claim 6, wherein the switched capacitor circuit further comprises a third capacitor and the switching circuit comprises:
   a first switch; and
   a second switch, wherein the first capacitor is coupled between the first switch and the second switch, the first switch and the second switch are conducted in response to a first clock signal of the plurality of clock signals, in order to sample the input signal to the first capacitor and to reset the third capacitor.

8. The analog-to-digital converter device of claim 7, wherein a time interval of the conversion clock signal having an enabling level is configured to follow a time interval of the first clock signal having the enabling level.

9. The analog-to-digital converter device of claim 7, wherein a time interval of the SAR circuitry performing the analog-to-digital conversion is configured to follow a time interval of the first switch and the second switch being conducted.

10. The analog-to-digital converter device of claim 7, wherein the switching circuit further comprises:
   a third switch coupled between a node that is between the first capacitor and the third capacitor, the third switch configured to be conducted according to a second clock signal of the plurality of clock signals, and the third capacitor is coupled to the first capacitor to store the first residue signal via the third switch;
   a fourth switch coupled between the second capacitor and the third capacitor; and
   a fifth switch coupled between the second capacitor and ground, wherein the fourth switch and the fifth switch are configured to be conducted according to a third clock signal of the plurality of clock signals, and the second capacitor is coupled to the third capacitor to store the second residue signal via the fourth switch.

11. The analog-to-digital converter device of claim 10, wherein the second residue signal is a result of charge sharing of the second capacitor and the third capacitor.

12. The analog-to-digital converter device of claim 10, wherein the combination of the first residue signal and the second residue signal is a summation of the first residue signal and the second residue signal.

13. The analog-to-digital converter device of claim 10, wherein the switching circuit further comprises:
   a sixth switch coupled between the node and the second capacitor, the sixth switch configured to be conducted according to a fourth clock signal of the plurality of clock signals.

14. The analog-to-digital converter device of claim 13, wherein the sixth switch is open when the fourth switch and the fifth switch are conducted.

15. The analog-to-digital converter device of claim 13, wherein the combination of the first residue signal and the second residue signal is a difference between the first residue signal and the second residue signal.

16. The analog-to-digital converter device of claim 13, wherein when both of the first clock signal and the third clock signal have disabling levels, the fourth clock signal has an enabling level.

17. The analog-to-digital converter device of claim 10, wherein a time interval of the second clock signal having an enabling level is configured to follow a time interval of the conversion clock signal having an enabling level.

18. The analog-to-digital converter device of claim 10, wherein a time interval of the third clock signal having an enabling level is configured to follow a time interval of the second clock signal having an enabling level.

19. The analog-to-digital converter device of claim 5, wherein the SAR circuitry comprises:
   a comparator circuit coupled to the second capacitor; and
   a control logic circuit coupled to the comparator circuit,
   wherein the comparator circuit and the control logic circuit are configured to be enabled according to the conversion clock signal to perform the analog-to-digital conversion, in order to generate the digital output and the first residue signal on the first capacitor.

20. The analog-to-digital converter device of claim 19, wherein the first capacitor is implemented with a binary capacitor array, and the binary capacitor array is under a control of the control logic circuit.

* * * * *